United States Patent
Kamimura et al.

[19]

[11] Patent Number: 6,159,757
[45] Date of Patent: Dec. 12, 2000

[54] PROCESS FOR PRODUCING A SOLAR BATTERY AND A SHEET MATERIAL FOR PROTECTIVE COVERING THEREOF

[75] Inventors: Kunio Kamimura, Kashiba; Hideyuki Ueyama, Nara, both of Japan

[73] Assignee: Sharp Kabushiki Kaisha, Osaka, Japan

[21] Appl. No.: 09/211,042

[22] Filed: Dec. 15, 1998

[30] Foreign Application Priority Data

Dec. 16, 1997 [JP] Japan ................................ 9-346146
Sep. 9, 1998 [JP] Japan ............................... 10-254950

[51] Int. Cl.⁷ .................................................. H01L 21/00
[52] U.S. Cl. ................... 438/19; 438/64; 438/80; 438/460; 438/462
[58] Field of Search .................. 438/19, 64, 80, 438/460, 462

[56] References Cited

U.S. PATENT DOCUMENTS

| | | |
|---|---|---|
| 4,283,590 | 8/1981 | Bilger et al. .......................... 136/251 |
| 4,909,856 | 3/1990 | Ralph . | |
| 4,968,372 | 11/1990 | Maass ..................................... 156/249 |

FOREIGN PATENT DOCUMENTS

| | | |
|---|---|---|
| 62-49675 | 6/1987 | Japan . |
| 3-109356 | 3/1991 | Japan . |
| 3-126063 | 3/1991 | Japan . |
| 3-61357 | 3/1991 | Japan . |
| 2 134 688 | 8/1984 | United Kingdom . |
| 89/05521 | 6/1989 | WIPO . |

*Primary Examiner*—John F. Niebling
*Assistant Examiner*—David A. Zarneke
*Attorney, Agent, or Firm*—Nixon & Vanderhye, P.C.

[57] ABSTRACT

A process for producing a solar battery comprising a step of preparing a sheet material for protective covering having an adhesion surface which is large enough for attaching thereon a plurality of solar battery bodies; a step of applying an adhesive to at least one of adhesion surfaces of the sheet material for protective covering or the solar battery bodies; a step of bonding the solar battery bodies to the sheet material for protective covering; and a step of cutting the resulting solar battery bodies into a desired number of the solar battery bodies covered with the sheet material.

14 Claims, 12 Drawing Sheets

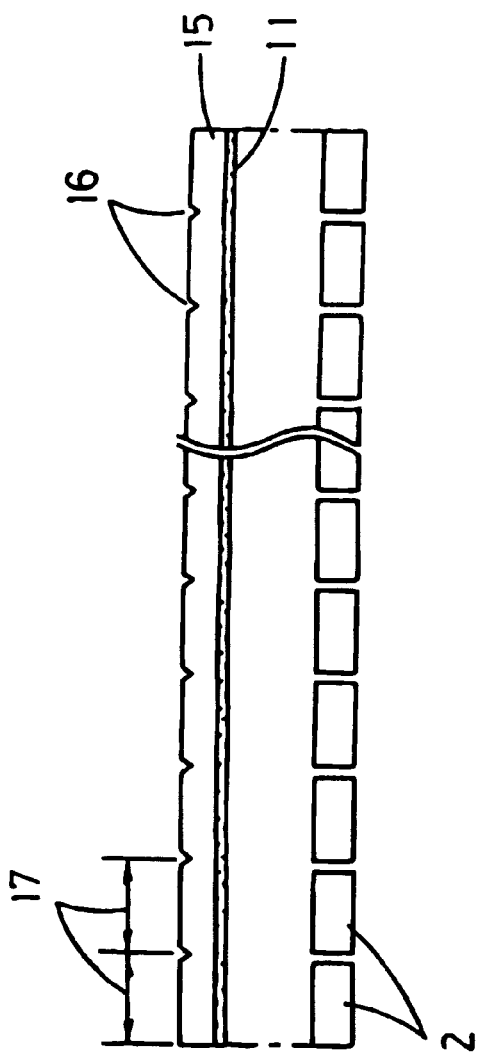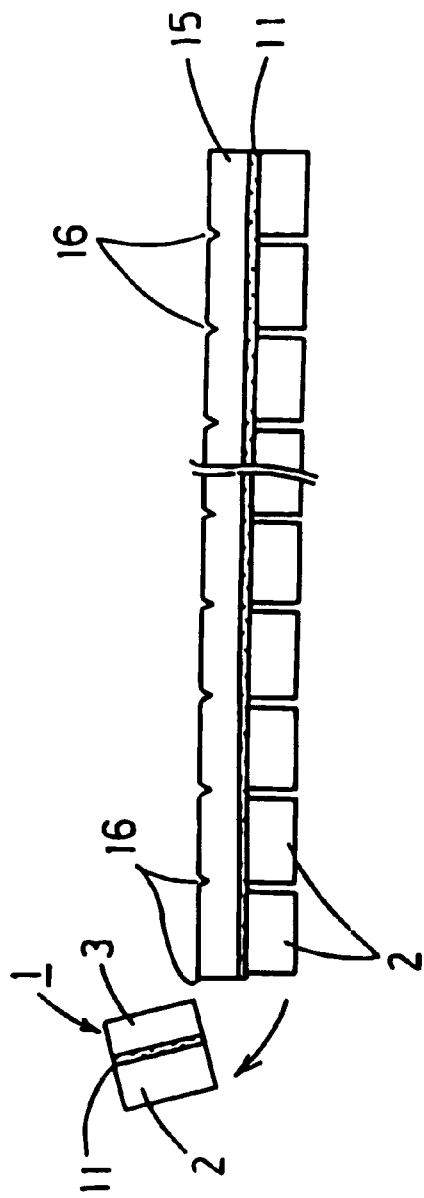
Fig.3(a)
Fig.3(b)

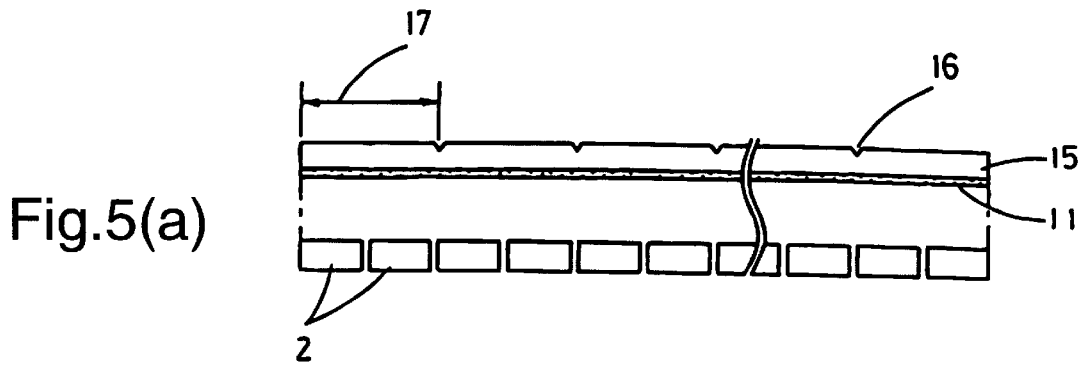
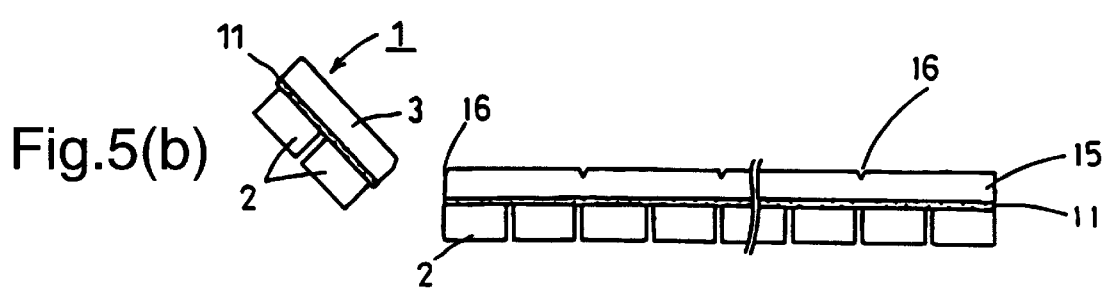
Fig.5(a)
Fig.5(b)
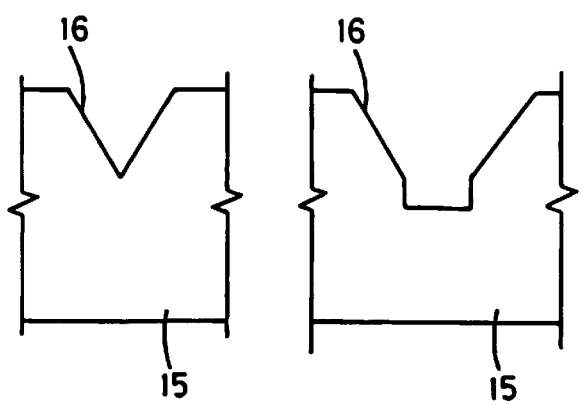
Fig.6(a)　　Fig.6(b)

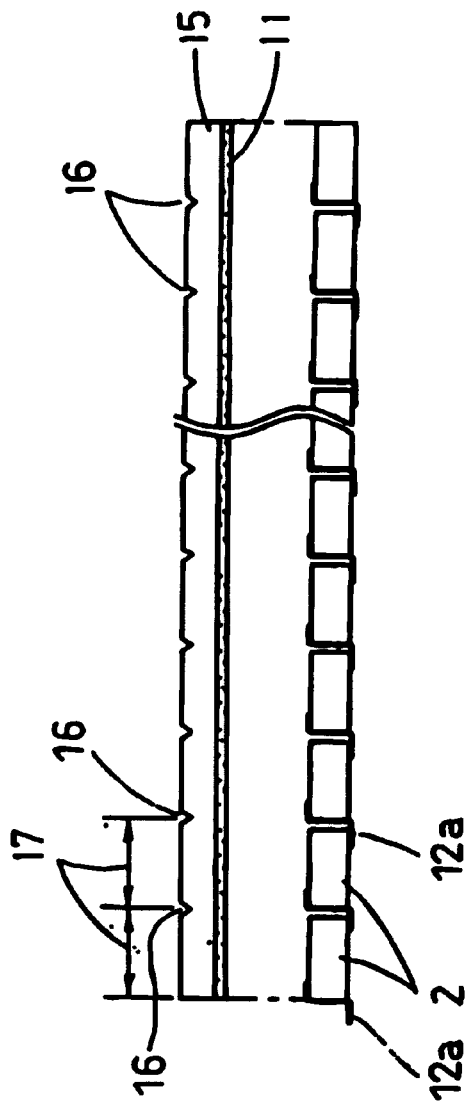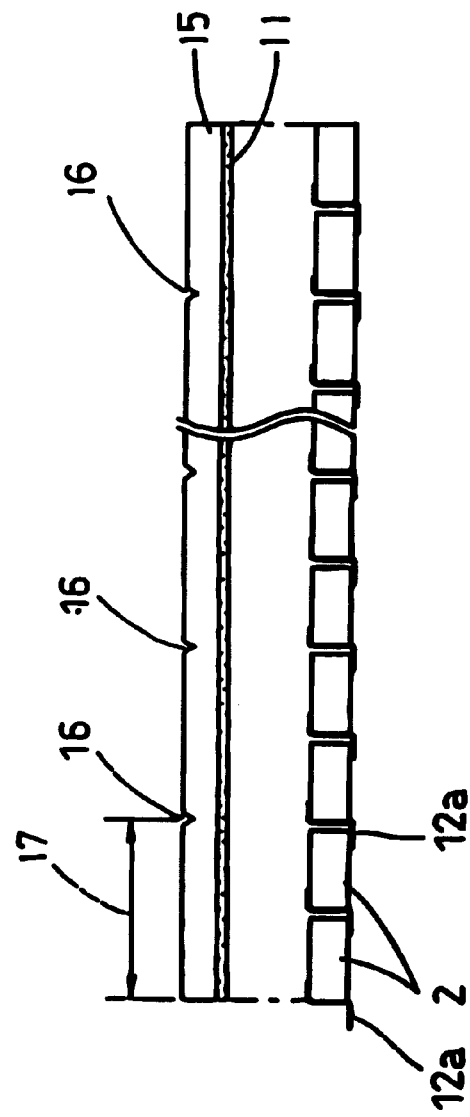

PROCESS FOR PRODUCING A SOLAR BATTERY AND A SHEET MATERIAL FOR PROTECTIVE COVERING THEREOF

CROSS-REFERENCE TO RELATED APPLICATION

This application is related to Japanese applications Nos. Hei 9(1997)-346146 and Hei 10(1998)-254950, filed on Dec. 16, 1997 and Sep. 6, 1998 whose priorities are claimed under 35 USC §119, the disclosures of which are incorporated by reference in their entirety.

BACKGROUND OF THE INVENTION

1. Field of the Invention

The present invention relates to a process for producing a solar battery in which a protective cover made of a material capable of transmitting light is attached to surfaces of solar battery bodies and also relates to a sheet material for which is made into protective covers of solar batteries by being divided.

2. Description of Related Art

In a solar battery installed in a power supply device of an artificial satellite, a protective cover made of glass or the like is generally used for avoiding effect of radiation. Conventionally, the protective cover is adhered to a surface of each solar battery body by means of an adhesive which is usually transparent.

The number of solar batteries used in one artificial satellite amounts to several thousands to several ten thousands. Tremendous amounts of work must be done for bonding the protective covers to all the solar batteries one by one.

Moreover, the adhesive used for bonding may sometimes leak out from between solar battery bodies and protective covers during bonding process. The leaked adhesive colors due to exposure to intensive ultraviolet rays and radiation in space, and the light transmissivity of the solar batteries is lowered. As a result, the amount of light received by the solar batteries decreases and electrical output declines. For this reason, it is necessary to remove the leaked adhesive as a finishing process. However this finishing process is considerably troublesome since the solar battery bodies and the protective covers are extremely thin.

Alternatively, in order to reduce the amount of the leaked adhesive, the use amount of the adhesive might be reduced to its minimum necessary amount. However, this may cause air bubbles to remain in the adhesive, which result in adhesion failure. For this reason, the use amount of the adhesive cannot simply be reduced for controlling leakage of the adhesion.

SUMMARY OF THE INVENTION

The present invention provides a process for producing a solar battery comprising
- a step of preparing a sheet material for protective covering having an adhesion surface which is large enough for attaching thereon a plurality of solar battery bodies;
- a step of applying an adhesive to at least one of adhesion surfaces of the sheet material for protective covering or the solar battery bodies;
- a step of bonding the solar battery bodies to the sheet material for protective covering; and
- a step of cutting the resulting solar battery bodies into a desired number of the solar battery bodies covered with the sheet material.

In another aspect, the present invention provides a process for producing a solar battery comprising
- a step of preparing a sheet material for protective covering having an adhesion surface which is large enough for attaching thereon a plurality of solar battery bodies;
- a step of applying an adhesive to at least one of adhesion surfaces of the sheet material for protective covering or the solar battery bodies;
- a step of bonding the solar battery bodies to the sheet material for protective covering; and
- a step of cutting the resulting solar battery bodies into a desired number of the solar battery bodies covered with the sheet material.

BRIEF DESCRIPTION OF THE DRAWINGS

These and other objects and advantages of the invention will become apparent during the following explanation with reference to the accompanying drawings in which:

FIGS. 3(a) and 3(b) are front views illustrating the steps of bonding a sheet material for protective covering to solar battery bodies and of separating the sheet material;

FIGS. 5(a) and 5(b) are front views illustrating the steps of adhering a sheet material for protective covering to solar battery bodies and of separating the sheet material;

FIGS. 6(a) and 6(b) are enlarged views illustrating a major part of a sheet material used for a first modified embodiment in accordance with the present invention;

FIGS. 11(a) and 11(b) are front views illustrating the step of bonding a sheet material for protective covering shown in FIG. 10 to solar batteries;

DESCRIPTION OF THE PREFERRED EMBODIMENTS

The present invention is now described in detail by way of embodiments thereof with reference to the accompanying drawings.

Figure 1:
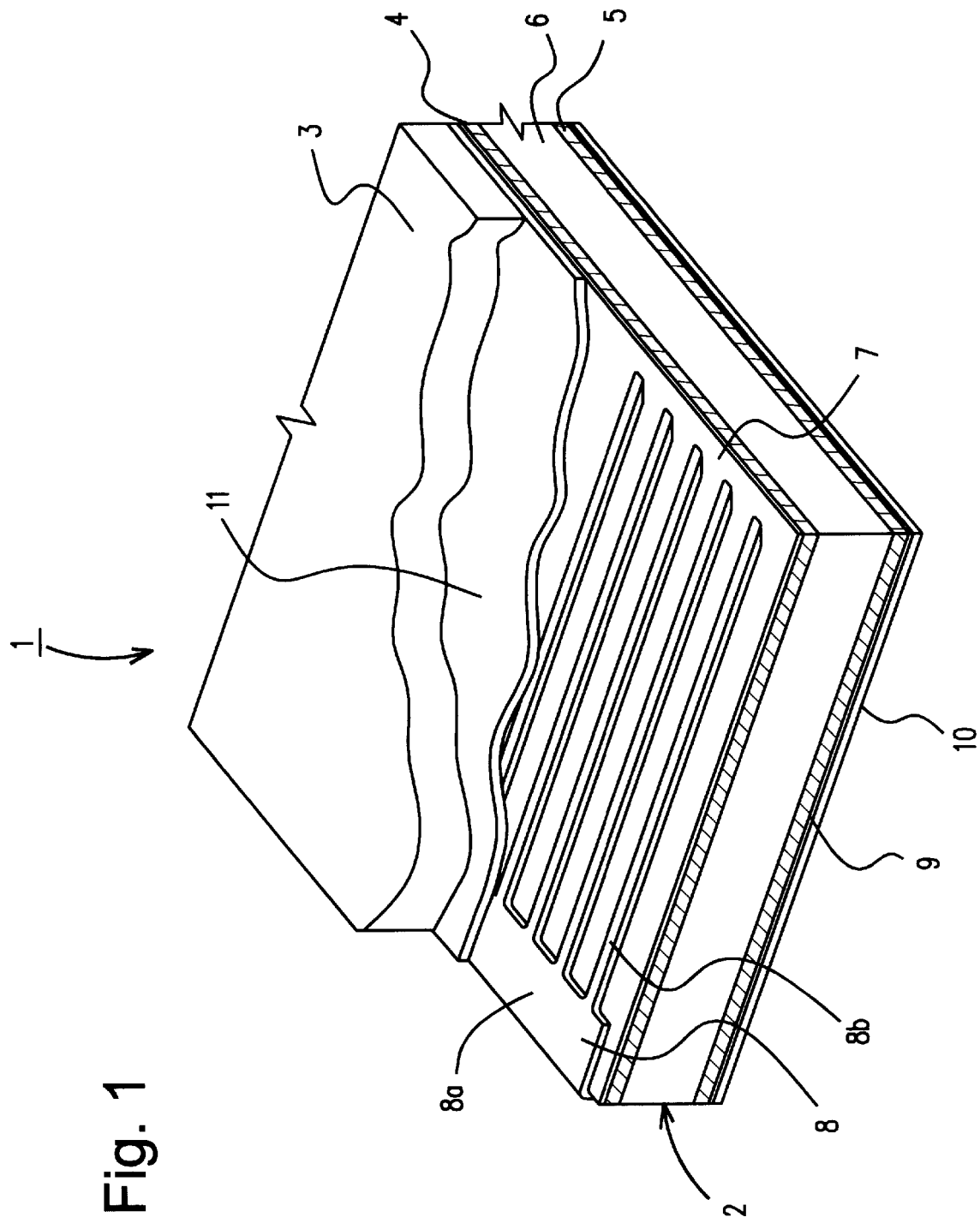
FIG. 1 is a partial cutaway prospective view illustrating the structure of a solar battery in accordance with the present invention.

FIG. 1 is a partial cutaway perspective view illustrating the structure of a solar battery produced by the process for fabricating a solar battery in accordance with an embodiment of the present invention. Referring to FIG. 1, the structure of the solar battery of this embodiment is described. The reference numeral 1 generally denotes a solar battery. The solar battery 1 may be installed, for example, in a power supply device of an artificial satellite. The solar battery 1 has the shape of a rectangle of about 2 cm length×2 cm width to about 10 cm length×10 cm width in top view. Currently, as the solar battery 1, solar batteries having a size of about 4 cm length×7 cm width in top view are often used. The solar battery 1 includes a solar battery body 2 and a protective cover 3 for avoiding or reducing the effect of radiation on the solar battery body 2. A material for the protective cover 3 is preferably glass, for example, but is not limited thereto in the present invention. The protective cover 3 is attached to the solar battery 2 to cover the surface thereof for the purpose of avoiding the effect of radiation on the solar battery 2, as described above, and for other purposes.

The solar battery body 2 is in the shape of a rectangle having the above mentioned size in top view. The solar battery body 2 is provided with an N$^+$ diffusion layer 4, a P$^+$ diffusion layer 5 and a P-type silicon substrate 6. The N$^+$ diffusion layer 4 is provided over a front surface of P-type silicon substrate 6, and the P$^+$ diffusion layer 5 is provided over a back surface of the P-type silicon substrate 6. It is noted that the terms (front) and (back) are used here only for convenience of explanation. An anti-reflection film 7 is provided over the surface of the N$^+$ diffusion layer 4, and an electrode 8 is provided on the surface of the anti-reflection film 7. The electrode 8 (referred to as N electrode 8 for convenience sake since it is connected with the N+diffusion layer 4) is composed of a base 8a and a plurality of comb teeth 8b extending in parallel from the base 8a. The base 8a of the N electrode 8 extends to the back surface of the solar battery body 2 to form a back-side extension (not shown).

A back reflection film 9 is provided on the back side of the P-type silicon substrate 6. An electrode 10 is provided over the surface of the back reflection film 9 (this electrode is referred to as "P electrode 10" for convenience sake since it is connected with the P$^+$ diffusion layer 5). The back-side extension of the N electrode 8 is extended onto the surface of the P electrode 10 with electric insulation from the P electrode 10. With this arrangement, where two solar batteries 1 are adjacently disposed, for example, the back-side extension of the N electrode 8 of the solar battery body 2 of one solar battery 1 to be connected with the P electrode 10 of the solar battery body 2 of the other solar battery 1. Thus the two solar batteries can be connected in series.

A solar battery including a solar battery body 2 of this structure is generally called a wrap-around solar battery. A protective cover 3 is attached to the surface (here, on the side where the anti-reflective film 7 and the N electrode 8 are disposed) of the solar battery body 2 constructed as described above with intervention of an adhesive 11, for example, of silicone resin.

When a solar battery provided with the solar battery body 2 of the above-described structure is installed for use in a power supply device of an artificial satellite, properties of the solar battery body 2 are susceptible to deterioration due to exposure to radiation. To minimize such deterioration of properties, the solar battery body 2 is designed to be thin, for example, about 50 nm to 100 nm thick. The protective cover 3 is provided to prevent the exposure of the solar battery body 2 to radiation, especially for preventing the exposure thereof to low-energy protons. Further an anti-coloring agent, for example, cerium, may prevent coloring due to radiation. The thickness of the protective cover 3 is determined mainly by tradeoffs of a dosage of radiation (which varies depending on the orbit of the artificial satellite) and the weight of the protective cover (a lighter protective cover is more advantageous in view of being carried by the artificial satellite). The thickness is usually about 100 nm to 50 nm, preferably 100 nm to 200 nm.

Next, explanation is given to how the solar battery 1 having the solar battery body 2 and the protective cover 3 is fabricated.

Figure 2:
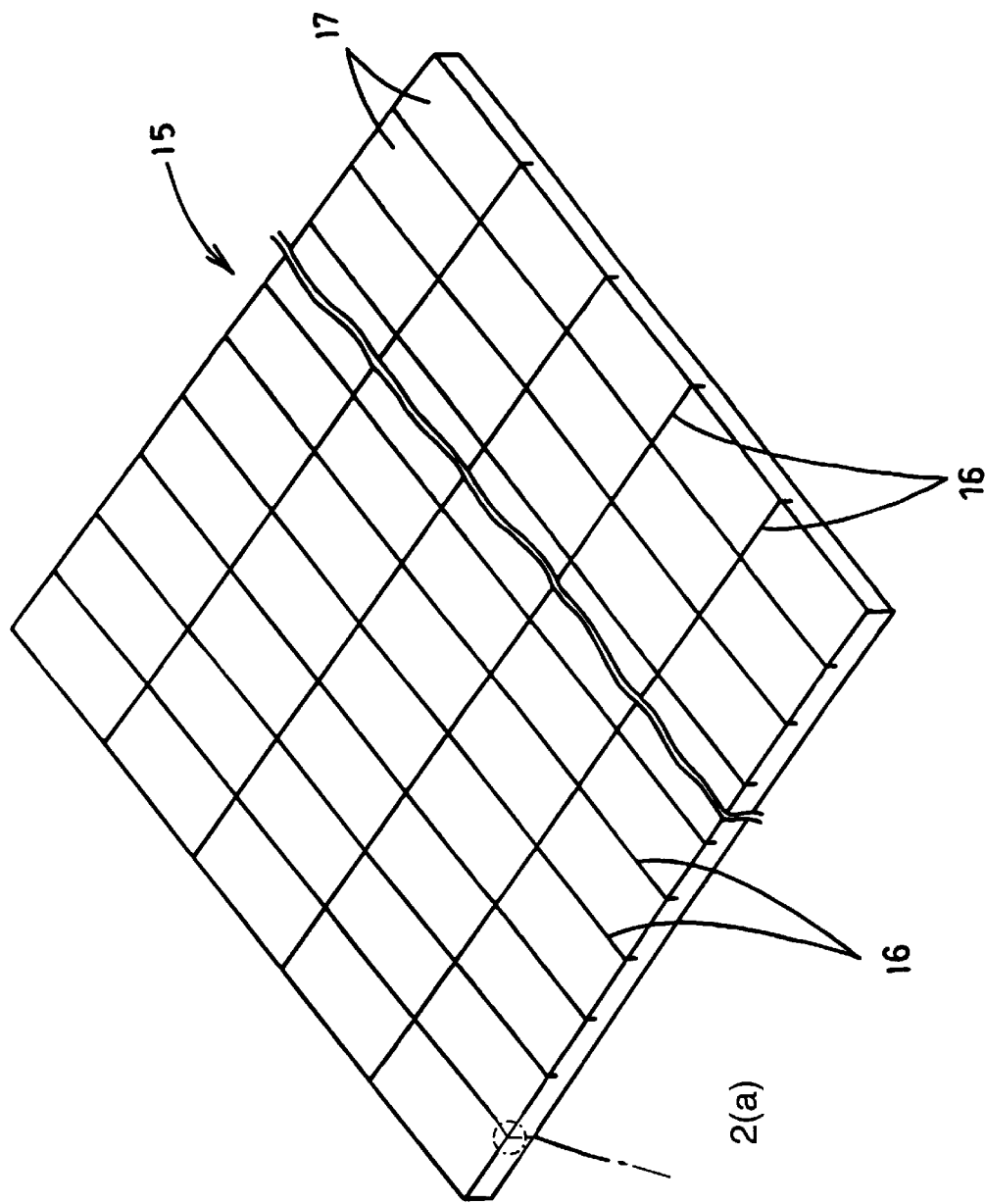
FIG. 2 is a prospective view illustrating a sheet material for protective covering used in an embodiment in accordance with the present invention.
Figure 2A:
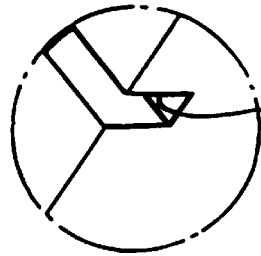

First, a protective cover sheet (a sheet material for protective covering) 15 as shown in FIG. 2 is prepared. Material for this protective cover sheet 15 may preferably be glass, for example, for the purpose of avoiding or reducing as much effect of radiation from space as possible, but it not limited thereto. In the case where a plurality of solar battery bodies 2 are desired to be regularly arranged in matrix on a plane, the protective cover sheet 15 has an adhesion face large enough for attaching all the solar battery bodies 2 together, on one side (in FIG. 2, on the back side).

Then, on the other side (in FIG. 2, on the front side) of the protective cover sheet 15, a plurality of grooves (separation guide grooves) 16 for guiding separation of the sheet are formed in a lattice form. In this case, the separation guide grooves 16 are formed in lattice to be so spaced to define adhesion areas 17 for the individual solar battery bodies 2. That is, the separation guide grooves 16 are arranged in the lattice form in such a manner that each vertical groove and each lateral groove define a vertical boundary and a lateral boundary between adhesion areas 17 for solar battery bodies 2. The separation guide grooves 16 are formed to have such a depth that the protective cover sheet 15 neither are cut apart completely nor deform owing to its own weight.

In the above-described embodiment, the separation guide groove 16 is linearly continuous, but the separation guide groove 16 is not limited to this configuration. For example, the separation guide groove 16 may be a set of grooves with bottoms which are provided intermittently in a direction of separation. The separation guide groove may be as shallow as just scribed as long as the grooves are weak enough to allow separation of the protective cover sheet 15 along the grooves.

The cross section of the separation guide groove is not limited to a particular shape, but may be in a V-, U- or Y-shape, for example.

Figure 4:
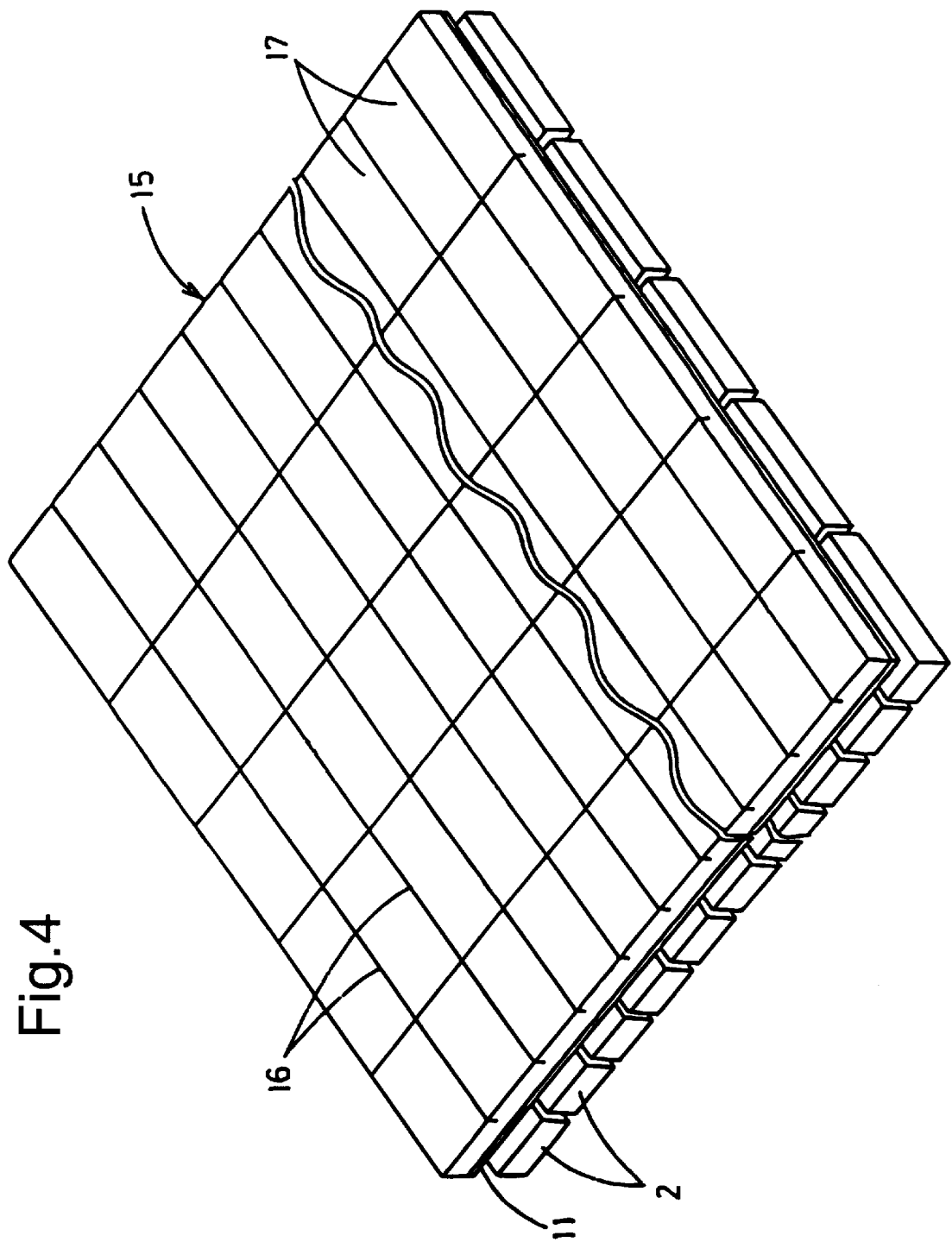
FIG. 4 is a perspective view illustrating the step of bonding a sheet material for protective covering to solar battery bodies.
Figure 7:
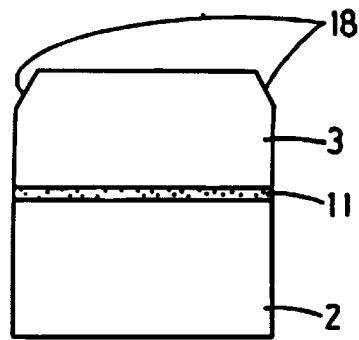
FIG. 7 is a front view illustrating the structure of a solar battery produced by the first modified embodiment.

After the separation guide groove 16 is formed on the protective cover sheet 15 in the above-described manner, an adhesive 11 is applied to the back surface of the protective cover sheet 15 in a uniform thickness as a bonding step, as shown in FIG. 3(a) and FIG. 4. Then the plural solar battery bodies 2 are bonded on the adhesion face on the back surface of the protective cover sheet 15 which face is coated with the adhesive 11. At this time, the solar battery bodies are so bonded to the back surface of the protective cover sheet 15 in such a manner that the individual solar battery bodies correspond to the individual adhesion areas 17.

In the above step, the solar battery bodies 2 are bonded to the back surface of the protective cover sheet 15 which is a single sheet and is sufficiently large compared with all the solar battery bodies. Therefore, a bonding work in this step is far easier than to bond the protective covers 3 to the solar battery bodies 2 one by one, and time necessary for the whole boding work is also shortened greatly. Further, during the adhesion of the solar battery bodies 2, the adhesive 11 does not come out in central part of the front surface of the protective cover sheet 15 (i.e., other part of the protective cover sheet than peripheral part thereof). However, the adhesive 11 may leak out from the peripheral part (sides) of the protective cover sheet 15 depending upon the amount of the adhesive 11. Even in such a case, since the protective cover sheet 15 is designed to be a single sheet far greater than the individual solar battery bodies 2, operation for removing the leaked adhesive is carried out only on the single, large protective cover sheet 15. Thus, the work for removing the adhesive is reduced compared with the conventional operation of removing the adhesive from the individual batteries one by one. Therefore, this work for removing the adhesive is also much eased and time necessary for the operation is shortened greatly.

After the adhesive 11 dries and the protective cover sheet 15 is firmly bonded to the solar battery bodies 2, the protective cover sheet 15 is cut along the separation guide grooves 16 as a cutting step as shown in FIG. 3(b), thereby to obtain solar batteries 1 each composed of the solar battery body 2 and the protective cover 3. The cutting of the protective cover sheet 15 can be done by bending the protective cover sheet 15 along the separation guide groove 16 with the front face inside and thereby dividing the protective cover sheet 15 along the separation guide groove 16.

As described above, in the embodiment of the present invention, in which the protective cover sheet 15 is divided by being given a bending force, the production process becomes the easier.

Furthermore, because the adhesive 11 does not leak out in the central part of the front surface of the protective cover sheet 15, solar batteries 1 taken from the central part of the protective cover sheet 15 does not need the finishing work of removing the leaked adhesive at all.

The above-described embodiment may be modified into such a form as shown in FIGS. 5(a) and 5(b), wherein plural, for example two, solar battery bodies (two cells) 2 are bonded to one adhesion area 17 and then the protective cover sheet 15 is divided into adhesion areas. In the case shown in FIGS. 5(a) and 5(b), the cutting is facilitated because the number of cutting is reduced, compared with the case where the protective cover sheet 15 is divided for the individual solar battery bodies 2.

If the separation guide groove 16 is formed to have a V-shaped cross section as shown in FIG. 6(a) or a V-shaped cross section having a flat portion at the bottom as shown in FIG. 6(b), the protective cover 3 of the solar battery 1 obtained by the cutting of the protective cover sheet 15 has a chamfered portion 18 at an end edge which derives from the separation guide groove 16. The separation guide groove is formed to have a V-shape cross section in this way for the purpose of forming this chamfered portion 18, at the cutting of the protective cover sheet 15, from an incline on the inner wall of the separation guide groove 16. Such a chamfered portion is advantageous because it can prevent a crack in the protective cover 3 of the obtained solar battery 1. As long as the chamfered portion 18 can be formed, the cross section of the separation guide groove 18 is not limited to the above-mentioned V-shapes, but may be in a U-shape or in other shape.

Figure 8:
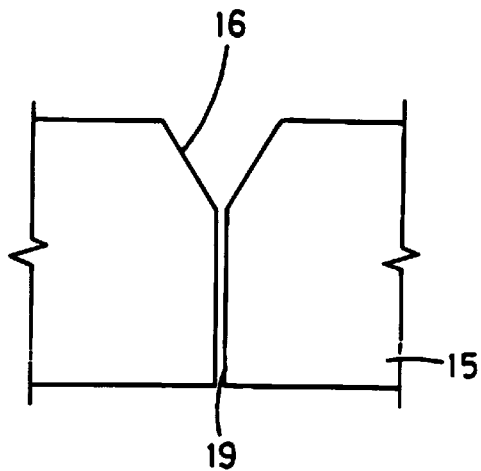
FIG. 8 is enlarged view illustrating a major part of a sheet material used for a second modified embodiment in accordance with the present invention.
Figure 9:
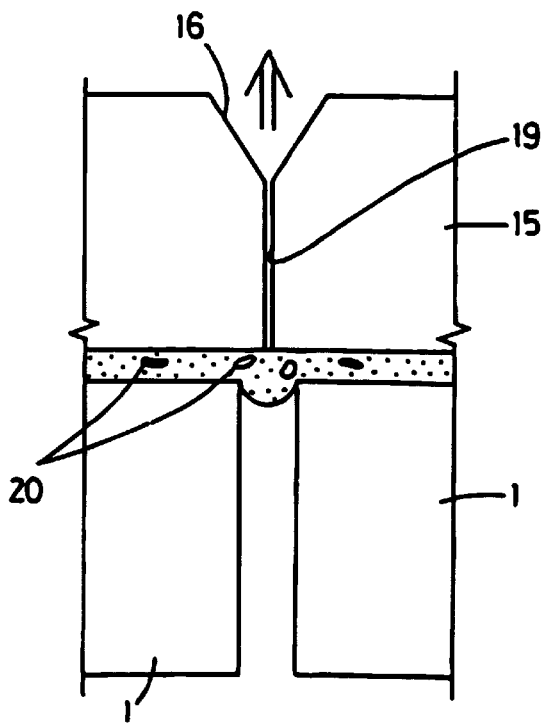
FIG. 9 is a enlarged view of a major part illustrating a deaerating step carried out in the second modified embodiment.

Further, as shown in FIG. 8, a though-hole 19 formed in a direction of the thickness of the protective cover sheet 15 to reach the back surface of the protective cover sheet 15 will provide the following advantage. Deaeration can be performed by a vacuum defoaming or the like from the front surface side after the adhesion of solar battery body 2 to the protective cover sheet 15 having the through-hole but before the drying of the adhesive, as shown in FIG. 9. This enables the adhesive 11 to spread uniformly over the back surface of the protective cover sheet 15. In addition to that, an air bubble 20 generated in the adhesive 11 can be removed. The air bubble 20 in the adhesive 11 reduces an adhesion area of the adhesive 11 thereby to weaken adhesive power. Therefore, if the air bubble 20 can be removed, then the adhesive 11 can be spread on the entire surface of the protective cover sheet 15 and the solar battery body 2 can be firmly bonded to the protective cover sheet 15 even with the minimum necessary amount of the adhesive. If the solar battery body 2 can be firmly bonded to the protective cover sheet 15 with the minimum necessary amount of the adhesive, the adhesive 11 need not be used in an excess amount and can be prevented from leaking out from the peripheral part of the protective cover sheet 15. As a result, the production process is further eased since the operation of removing leaked adhesive is not required any more.

Some of the adhesive 11 may leak out through the through-hole 19 onto the front surface of the protective cover sheet 15 at the deaeration. However, such leak of the adhesive 11 can be prevented by adjusting suction force and/or suction time at the deaeration. Even if the adhesive 11 leaks out onto the front surface of the protective cover sheet 15, the removal of the leaked adhesive 11 may be performed only on the single protective cover sheet 15 which has a large surface area. For this reason, the removal of the adhesive 11 becomes easier, compared with the operation of removing the adhesive 11 from the individual solar batteries.

Preferably, the through-holes are provided at a rate of 0.5 to 2/1 solar battery in the protective cover sheet 15 so that the deaeration of the adhesive 11 is performed effectively. The through-holes is in the shape of a circle, square or the like in top view.

In the above-described embodiment of the present invention, used are the solar battery bodies 2 which are called wrap-around type batteries. In the solar battery body 2 of wrap-around type, as described above, provided are the $N^+$ diffusion layer 4 and the N electrode 8 on the front surface of the P-type silicon substrate 6, and provided are the $P^+$ diffusion layer 5, the P electrode 10 and the back-side extension of the N electrode 8 on the back surface of the P-type silicon substrate 6. Besides solar batteries of this type, the present invention can also be realized in the same manner as described above with solar battery bodies 2 generally called back electrode type batteries, in which an $N^+$ diffusion layer 4, a $P^+$ diffusion layer 5, an N electrode 8 and a P electrode 10 are all provided on a back surface of a P-type silicon substrate.

Figure 10:
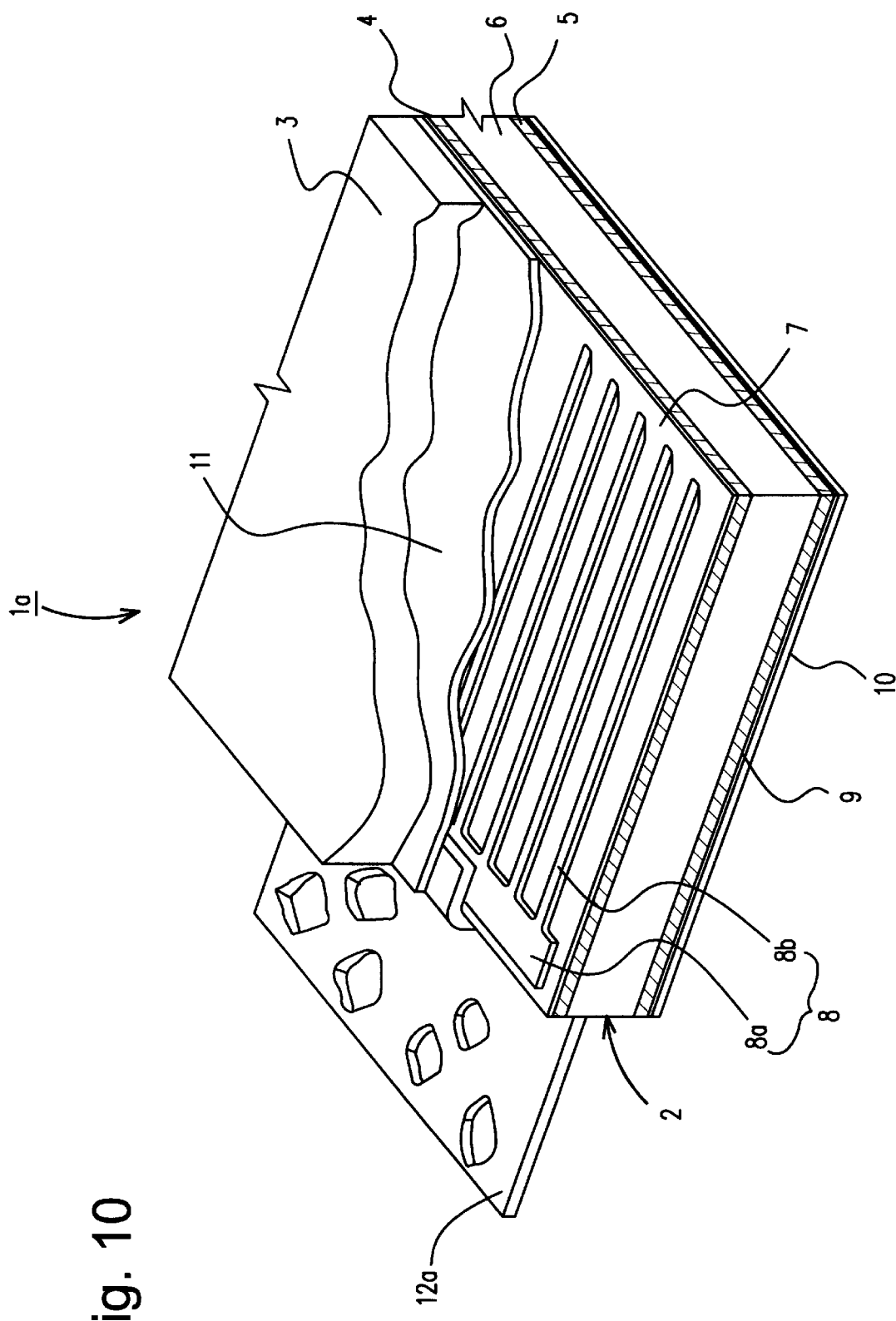
FIG. 10 is a partial cutaway perspective view illustrating the structure of a solar battery in accordance with another embodiment of the present invention.
Figure 12:
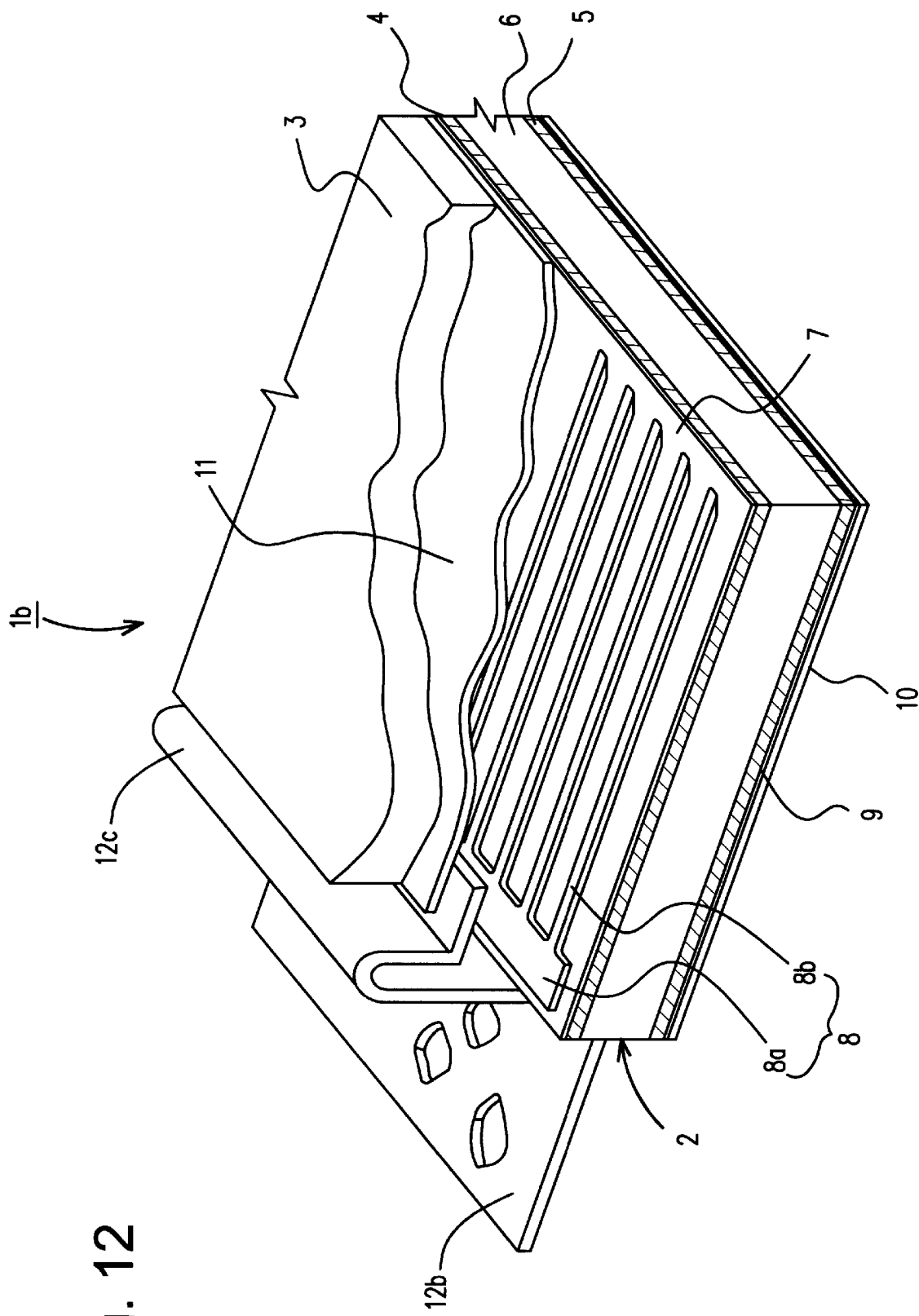
FIG. 12 a partial cutaway perspective view illustrating the structure of a solar battery in accordance with still another embodiment of the present invention.

In the above-described embodiments, the solar battery 1 includes the solar battery body 2 called the wrap-around type or the back electrode type, but the present invention can also be realized in the same manner with solar batteries 1a and 1b as shown in FIGS. 10 and 12. The solar battery 1a shown in FIG. 10 is provided with an interconnector 12a for connection with an adjacent solar battery. On the other hand, the solar battery 1b shown in FIG. 12 is provided with an interconnector 12b and a stress relief 12c for easing stresses on parts of the solar battery 1b. In these solar batteries 1a and 1b, the N electrode 8a does not extend to the back surface of the solar battery body 2 because the interconnectors 12a and 12b mediate electric connection for these solar batteries 1a and 1b.

Now explanation is given to the adhesion of the solar battery bodies 2 to the protective cover sheet 15 in the solar battery 1a shown in FIG. 10 by reference to FIGS. 11(a) and 11(b). FIG. 11(a) corresponds to FIG. 3(a), and FIG. 11(b) corresponds to FIG. 5(a). In both FIG. 11(a) and FIG. 11(b), the solar battery bodies 2 are bonded to the protective cover sheet 15 with the adhesive 11 in such a manner that the solar battery bodies 2 correspond to the adhesion areas 17 on the back surface of the protective cover sheet 15 and the interconnectors 12a of the solar battery bodies 2 are disposed under adjacent solar battery bodies 2. The cutting is done for every solar battery body 2 in the case of FIG. 11(a) and for every plural solar battery bodies 2, for example, for every two solar battery bodies (two cells) 2 in the case of FIG. 11(b).

In the solar battery 1a shown in FIG. 10, the same parts are denoted by the same reference numerals as in the solar battery 1 shown in FIG. 1, and the explanation thereof is omitted. The boding step for fabricating the solar battery 1a in FIG. 10 is shown in FIGS. 11(a) or 11(b). But the cutting steps corresponding to FIGS. 11(a) and 11(b) are the same as those shown in FIGS. 3(b) and 5(b), respectively, and therefore the illustration thereof is omitted.

Figure 13A:
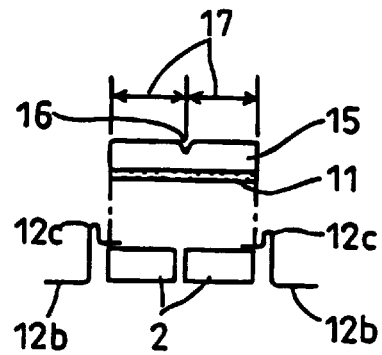
FIGS. 13(a) and 13(b) are front views illustrating the step of bonding a sheet material for protective covering shown in FIG. 12 to solar batteries.
Figure 13B:
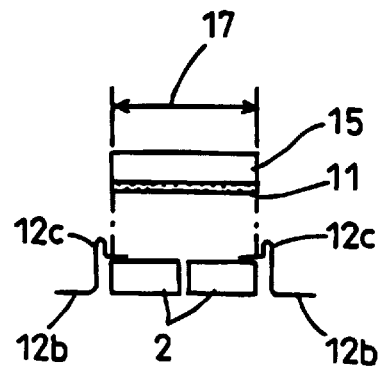

As regards the solar battery 1b shown in FIG. 12, the adhesion of solar battery bodies 2 to the protective cover sheet 15 is described by reference to FIGS. 13(a) and 13(b). FIGS. 13(a) and 13(b) correspond to FIGS. 3(a) and 5(a), respectively. In both FIGS. 13(a) and 13(b), the solar battery bodies 2 are bonded to the back surface of the protective cover sheet 15 with the adhesive 11 in such an orientation that the interconnectors 12b thereof are directed outward from the protective cover sheet 15. The cutting is done for every solar battery body 2 in the case of FIG. 13(a) and for every plural solar battery bodies, for example, for every two solar battery bodies (two cells) 2 in the case of FIG. 13(b). In FIG. 13(b), separation guide grooves 16 are not shown, but separation guide grooves 16 exist in parallel to the shown side.

In the solar battery 1b shown in FIG. 12, the same parts are denoted by the same reference numerals as in the solar battery 1 shown in FIG. 1, and the explanation thereof is omitted. The boding step for fabricating the solar battery 1b in FIG. 12 is shown in FIGS. 13(a) or 13(b). But the cutting steps corresponding to FIGS. 13(a) and 13(b) are the same as those shown in FIGS. 3(b) and 5(b), respectively, and therefore the illustration thereof is omitted.

Figure 14A:
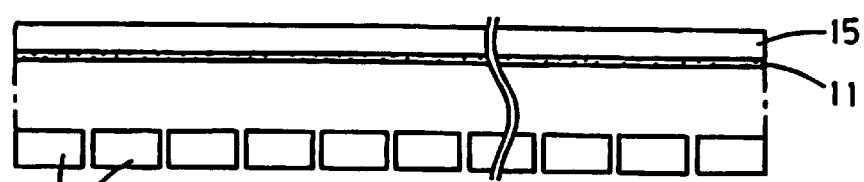
FIGS. 14(a) and 14(b) are front views illustrating a bonding step and a cutting step in accordance with a third modified embodiment of the present invention.
Figure 14B:
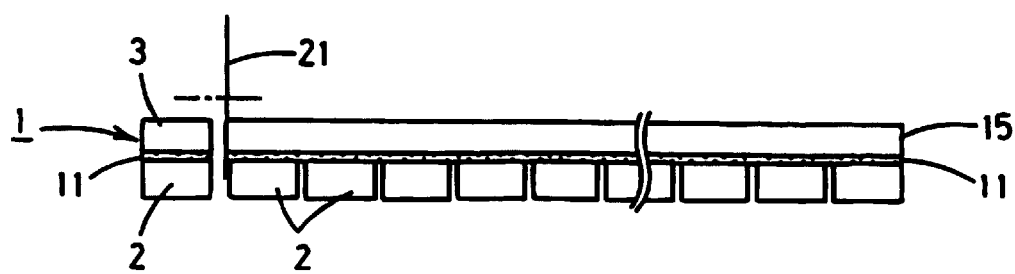

Though the separation guide grooves 16 are formed on the protective cover sheet 15 in the above-described embodiments, the present invention can also be realized in an embodiment having no separation guide grooves 16 that are formed on the front surface of the protective cover sheet 15. As shown in FIG. 14(a), an adhesive 11 are coated on the back surface of a protective cover sheet 15 having no separation guide grooves 16. Then a plurality of solar battery bodies 2 are attached thereon. Subsequently, as shown in FIG. 14(b), the protective cover sheet 14 is separated by cutting along boundaries of adjacent battery bodies 2 using a cutting device 21 such as a dicing saw or a cutting laser. Solar batteries 1 are thus obtained. In this case, since the adhesion areas 17 for bonding the solar battery bodies 2 are not defined on the protective cover sheet 15, the solar battery bodies 2 need not be attached with accurate placing in the adhesion areas 17. Accordingly, the bonding step is the less difficult. The solar battery 1 is thus fabricated which has the protective cover 3 and the solar battery body 2 bonded together with the adhesive 11 therebetween.

The present invention has another embodiment as describe below. Usually, solar battery bodies 2 are formed in large number on a single semiconductor substrate, for example, on a single silicon substrate. The silicon substrate serves as a photoelectric conversion layer common to all the solar battery bodies 2. The solar battery bodies 2 must be electrically separated from each other. Usually, the cutting of the silicon substrate accomplishes this electric separation and physical separation at the same time.

Figure 15A:
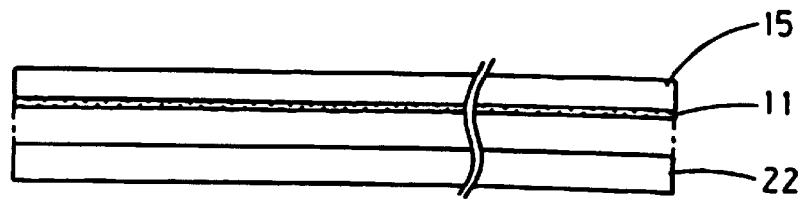
FIGS. 15(a) and 15(b) are front views illustrating a bonding step and a cutting step in accordance with a forth modified embodiment of the present invention.

As shown in FIG. 15(a), the semiconductor substrate (e.g., silicon substrate) 22, on which a great number of solar battery bodies 2 are formed, is bonded to the back surface of a protective cover sheet 15 coated with an adhesive 11, before the cutoff of the solar battery bodies 2. Then, as shown in FIG. 15(b), the protective cover sheet 15 and the silicon substrate 22 can be simultaneously cut by a cutting device 21 such as a dicing saw or by a cutting laser thereby to obtain solar batteries 1 in each of which the solar battery body 2 and the protective cover 3 are bonded together with the adhesive 11 therebetween.

Figure 15B:
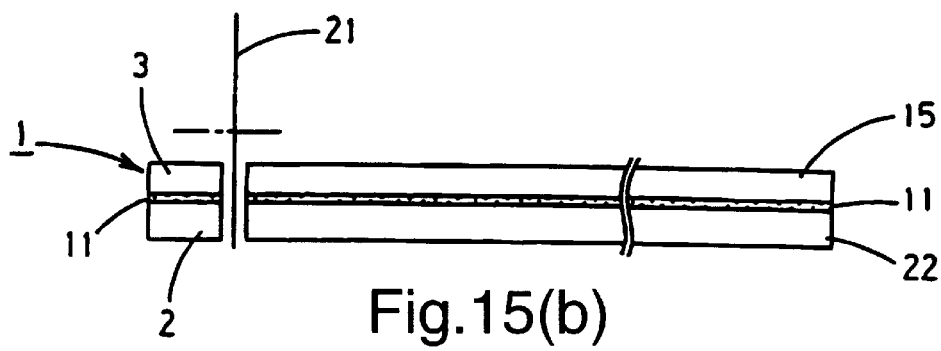

In this embodiment shown in FIGS. 15(a) and 15(b), no adhesion areas for receiving the solar battery bodies 2 are defined on the protective cover sheet 15, as in the embodiment shown in FIGS. 14 (a) and 14(b). For this reason, the solar battery bodies 2 need not be attached in adhesion areas with accuracy, and therefore the bonding step becomes easier. Further, instead of bonding individually separated solar battery bodies 2, the single silicon substrate 22 is bonded to the single protective cover sheet 15 before the separation thereof. Therefore, the bonding step also becomes easier. Further, since the solar battery bodies 22 are not required to be cut from the silicon substrate 22 beforehand, the production process is facilitated in this respect.

The present invention has still another embodiment as follows.

Figure 16A:
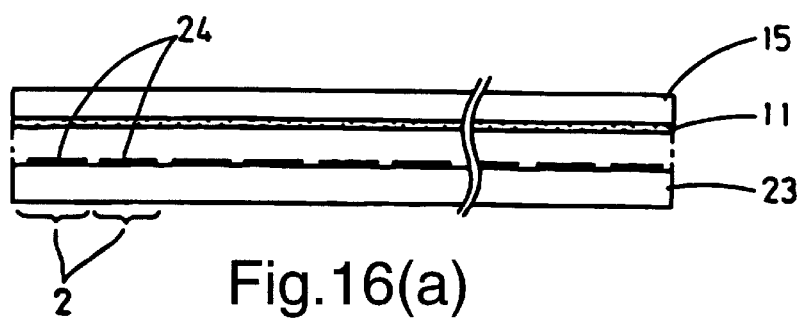
FIGS. 16(a) and 16(b) are front views illustrating a bonding step and a cutting step in accordance with a fifth modified embodiment of the present invention.

As shown in FIG. 16(a), a large number of photoelectric conversion layers 24 and electrodes are formed on a single substrate 23, for example, made of glass, thereby to form a large number of solar battery bodies 2. The single substrate 23 is for reinforcement of the photoelectric conversion layers 24, and actual photoelectric converting is performed by the photoelectric conversion layers 24. Examples of materials for the single substrate 23 are metals, resin films and the like as well as the above-mentioned glass. Examples of materials for making the photoelectric conversion layers 24 are amorphous silicon, a CdS-CdTe film, a CIS film and the like. Since the photoelectric conversion layers 24 are electrically, physically separated initially, the photoelectric conversion layers need not be electrically separated from each other by an additional step. The solar battery bodies 2 can be formed to connect in series so that a desired voltage can be obtained.

Figure 16B:
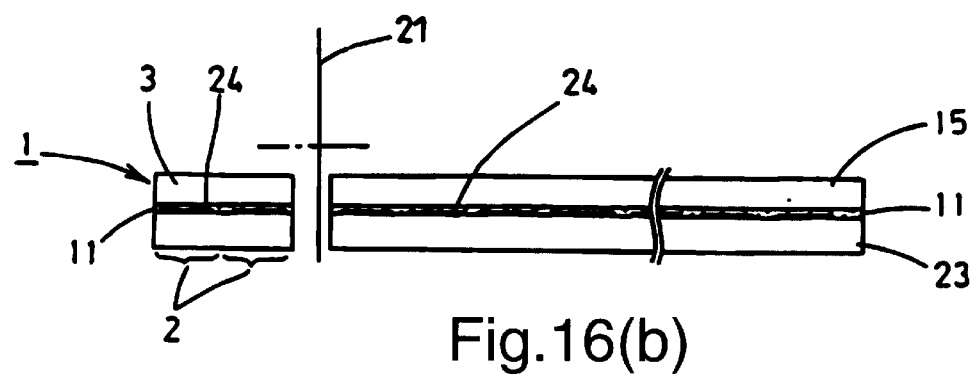

The single substrate 23 on which the large number of solar battery bodies 2 are formed is bonded to a single protective cover sheet 15 with an adhesive 11 and then divided by cutting. Since the photoelectric conversion layers are separated from each other as described above, the performance of the solar batteries is not affected even if cut sites are melted by heat generated at the cutting. For this reason, the invention has the advantage that a cutting laser can be readily used for the above-mentioned cutting. Further, as shown in FIG. 16(b), a plurality of the solar battery bodies 2 connected in series to provide a desired voltage [two solar battery bodies (two cells) 2 in this embodiment] may be cut out as a unit. Therefore, there is another advantage in that a desired voltage can be easily obtained by setting the number of the solar battery bodies 2 to be connected in series.

The above embodiment is explained in detail by reference to the FIGS. 17(a) and 17(b).

Figure 17A:
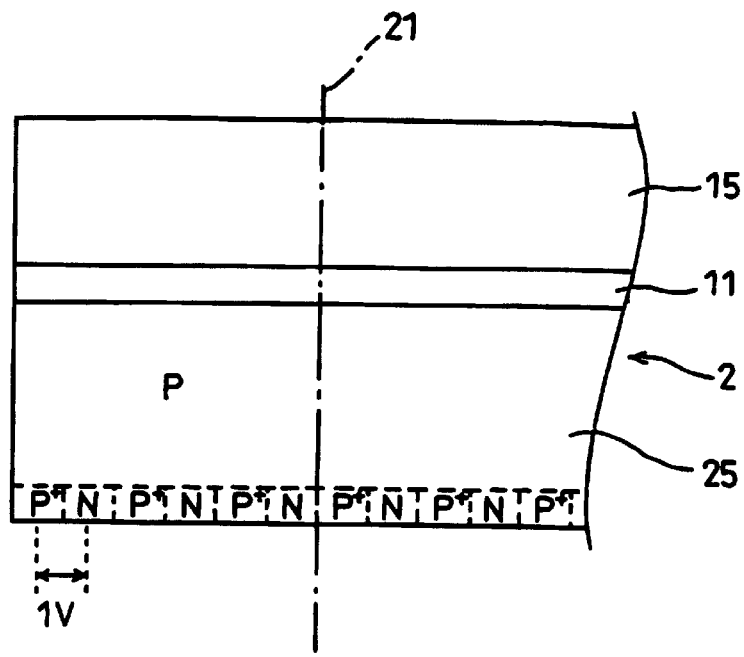
FIGS. 17(a) and 17(b) are front views illustrating solar batteries in accordance with the present invention.

FIG. 17(a) shows an embodiment using, as the single substrate, a semiconductor substrate having a photoelectric conversion layer 25 for solar battery bodies. In FIG. 17(a), solar battery bodies 2 are made up of a semiconductor substrate, e.g., a silicon substrate, having a large number of PN junctions as a photoelectric conversion layer 25. The semiconductor substrate is attached to a protective cover sheet 15 with an adhesive 11 and, while kept in this state, the semiconductor substrate is divided together with the protective cover sheet 15 into solar battery bodies 2. Thus the solar battery bodies 2 have a number of PN junctions therein. Since these PN junctions are not separated electrically, the voltage of the solar battery body 2 is a voltage of one PN junction, e.g., 1V, even if the semiconductor substrate is cut with a cutting device 21 at the position 21 shown in the figure.

Figure 17B:
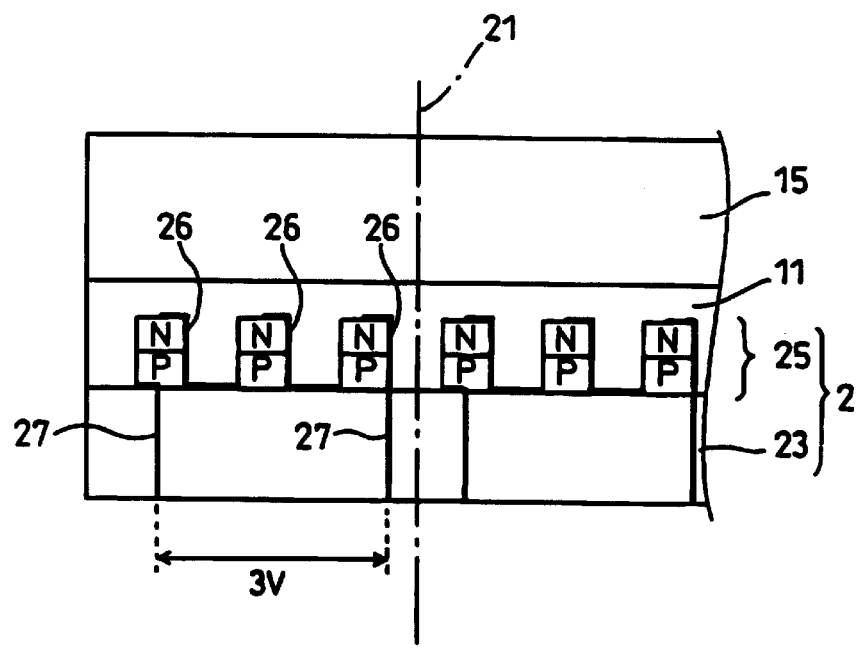

FIG. 17(b) shows an embodiment in which solar battery bodies 2 are formed using at least a single insulation substrate 23 (e.g. a glass substrate) and a photoelectric conversion layer 25 formed on the single substrate 23. In FIG. 17(b), the photoelectric conversion layer 25 in such a state that a large number of PN junctions are arranged separately is formed on the single substrate 23. Then, the single substrate 23 is bonded to a protective cover sheet 15 with an adhesive 11 and, while kept in this state, the single substrate is divided at the cutting position 21 shown in the figure into solar battery bodies 2 each having a photoelectric conversion layer 25 including three of the PN junctions connected together, as one unit (two cells). The embodiment of FIG. 17(b) can obtain a solar battery of 3V compared with the embodiment of FIG. 17(a). The reference numeral 26 denotes an electrode for connecting adjacent PN junctions in series and the reference numeral 27 denotes an electrode extended outside through an hole in the single substrate 23 which hole is opened for taking out the voltage produced by the three PN junctions connected in series.

In FIG. 1, the present invention has been described by example of a silicon solar battery, but the invention is not limited thereto. The invention is applicable to solar batteries using a compound semiconductor for the substrate, for example, GaP solar batteries.

As has been discussed above, the present invention facilitates the bonding step because a plurality of solar battery bodies in a state of being planarity arranged can be bonded to an adhesion face of a sheet material for protective covering with an adhesive by a single operation. Further, because a residual adhesive does not leak out on the surface in the central portion of the glass sheet for protective covering, the work of removing the residual adhesive is eased. Even if the residual adhesive has to be removed, its removal can be performed relatively easily. For these reasons, the present invention can facilitate the production of solar batteries.

Since the separation guide grooves are formed on the sheet material for protective covering, the sheet material for protective covering can be easily divided along the grooves, which makes the production of solar batteries further easier.

Also, in the case where through-holes are formed at bottom portions of the separation guide grooves, the adhesive is easily deaerated when the solar battery bodies are bonded to the sheet material for protective covering. Thus, the adhesive can be sufficiently spread to cover the entire surface of the sheet material for protective covering and the minimum necessary amount of the adhesive can provide sufficient bonding. Moreover, since the adhesive need not be used in an excess amount, leakage of the adhesive from the peripheral part of the sheet material can be substantially prevented. Thus the operation of removing the residual adhesive can be reduced. The production of solar batteries can be facilitated more.

Further, in the case where the separation guide grooves have inclined inner walls, the sheet material for protective covering after the cutting along the grooves will have chamfered side walls. This prevent cracks in the protective cover effectively.

In the case where a plurality of solar battery bodies are formed on a single substrate and then the substrate is bonded to the sheet material for protective covering, the bonding step is more facilitated than to bond individual solar battery bodies to the sheet material for protective covering, because the bonding work is carries out only on the single substrate and the singe sheet material for protective covering.

Further, in the case where the sheet material for protective covering and the single substrate adhered thereto are cut into batteries at the same time, the production of solar batteries is further facilitated.

In the case where the substrate for forming the solar battery bodies is a semiconductor substrate having a photoelectric conversion layer for the solar battery bodies, a separated piece of the semiconductor substrate will have PN junctions necessarily. Therefore, solar batteries of a desired voltage can be easily produced by selecting an appropriate cutting site.

In the case where the solar battery body is composed of at least a semiconductor substrate and photoelectric conversion layers formed on the semiconductor substrate, solar batteries generating a desired voltage can be easily produced by electrically connecting some of the photoelectric conversion layers in series so that the desired voltage is obtained and cutting out the photoelectric layers connected in series as one unit.

The solar batteries obtained by these process of the present invention is useful as power supply devices for equipment used outside the earth, for example, an artificial satellite.

What is claimed is:

1. A process for producing a solar battery comprising
   a step of preparing a sheet material for protective covering having an adhesion surface which is large enough for attaching thereon a plurality of solar battery bodies;
   a step of applying an adhesive to at least one of adhesion surfaces of the sheet material for protective covering or the solar battery bodies;
   a step of bonding the solar battery bodies to the sheet material for protective covering; and
   a step of cutting the resulting solar battery bodies into a desired number of the solar battery bodies covered with the sheet material.

2. A process according to claim 1, wherein the sheet material for protective covering has, on a surface opposite to the adhesion surface, a separation guide groove for separating the solar battery bodies into a desired number of solar battery bodies.

3. A process according to claim 2, wherein the separation guide groove of the sheet material for protective covering has a V-, U- or Y-shaped cross section.

4. A process according to claim 2, wherein the separation guide groove of the sheet material for protective covering has a through-hole at its bottom.

5. A process according to claim 4 further comprising the step of deaerating the adhesive via the through-hole between the bonding step and the cutting step.

6. A process according to claim 2, wherein the separation guide groove of the sheet material for protective covering is provided continuously or intermittently around sites where the solar battery bodies are attached.

7. A process according to claim 1, wherein the solar battery bodies are separated into groups of a desired number of solar battery bodies.

8. A process according to claim 1, wherein the solar battery bodies are formed on a single substrate and the substrate is separated at the same time as the sheet material for protective covering is separated.

9. A process according to claim 8, wherein the single substrate comprises a semiconductor substrate doubling as a photoelectric conversion layer.

10. A process according to claim 8, wherein the single substrate comprises an insulation substrate and a photoelectric conversion layer formed thereon.

11. A process according to claim 1, wherein the solar battery is used outside the earth.

12. A sheet material for protective covering usable in a process for producing a solar battery including:
   a step of preparing a sheet material for protective covering having an adhesion surface which is large enough for attaching thereon a plurality of solar battery bodies;
   a step of applying an adhesive to at least one of adhesion surfaces of the sheet material for protective covering or the solar battery bodies;
   a step of bonding the solar battery bodies to the sheet material for protective covering; and
   a step of cutting the resulting solar battery bodies into a desired number of the solar battery bodies covered with the sheet material,
   the sheet material for protective covering comprising a separation guide groove for separating the solar battery bodies into a desired number of solar battery bodies.

13. A sheet material according to claim 12, wherein the separation guide groove of the sheet material for protective covering has a V-, U- or Y-shaped cross section.

14. A sheet material according to claim 12, wherein the separation guide groove of the sheet material for protecting covering has a through-hole at the bottom thereof.

* * * * *